(12) United States Patent
Hsu et al.

(10) Patent No.: US 12,356,599 B2
(45) Date of Patent: Jul. 8, 2025

(54) STATIC RANDOM ACCESS MEMORY

(71) Applicant: UNITED MICROELECTRONICS CORP., Hsin-Chu (TW)

(72) Inventors: Chih-Kai Hsu, Tainan (TW); Chien-Hung Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 369 days.

(21) Appl. No.: 16/905,883

(22) Filed: Jun. 18, 2020

(65) Prior Publication Data

US 2021/0366913 A1 Nov. 25, 2021

(30) Foreign Application Priority Data

May 22, 2020 (CN) .......................... 202010439957.1

(51) Int. Cl.
*H10B 10/00* (2023.01)
(52) U.S. Cl.
CPC .................................... *H10B 10/12* (2023.02)
(58) Field of Classification Search
CPC ................. H01L 27/11; H01L 27/1104; H01L 29/41791; H10B 10/00; H10B 10/12
See application file for complete search history.

(56) References Cited

U.S. PATENT DOCUMENTS

| | | | |
|---|---|---|---|
| 6,236,117 B1 | 5/2001 | Ishigaki | |
| 6,326,257 B1 | 12/2001 | Hsu | |
| 6,836,428 B2 | 12/2004 | Nakura | |
| 9,379,119 B1 | 6/2016 | Huang | |
| 9,390,765 B2 | 7/2016 | Sato | |
| 9,589,966 B2 | 3/2017 | Hsu | |
| 9,893,064 B2 | 2/2018 | Chung | |
| 10,699,958 B2 | 6/2020 | Liu | |
| 2002/0180068 A1 | 12/2002 | Clevenger | |
| 2013/0258759 A1 | 10/2013 | Liaw | |
| 2014/0241027 A1 | 8/2014 | Hung | |
| 2016/0284705 A1* | 9/2016 | Chung | ........... H01L 21/823871 |
| 2016/0307882 A1* | 10/2016 | Chen | ................... H01L 27/0207 |
| 2016/0322366 A1* | 11/2016 | Hsu | ..................... H01L 27/0207 |
| 2019/0287899 A1 | 9/2019 | Nagai | |
| 2019/0348422 A1 | 11/2019 | Wang | |

(Continued)

FOREIGN PATENT DOCUMENTS

| | | |
|---|---|---|
| CN | 1213858 A | 4/1999 |
| CN | 1411072 A | 4/2003 |
| CN | 2718734 Y | 8/2005 |

(Continued)

*Primary Examiner* — Jesse Y Miyoshi
(74) *Attorney, Agent, or Firm* — Winston Hsu (57) ABSTRACT

A static random access memory (SRAM) includes a substrate having a first active region and a second active region adjacent to the first active region. A first gate structure is disposed on the substrate and across the first active region and the second active region. A second gate structure is adjacent to a first side of the first gate structure. A first lower contact structure is disposed on the first active region and adjacent to a second side of the first gate structure. A first upper contact structure is disposed on and in direct contact with the first lower contact structure. A top surface of the first lower contact structure and a sidewall of the first upper contact structure comprise a step profile therebetween.

11 Claims, 7 Drawing Sheets

(56) References Cited

U.S. PATENT DOCUMENTS

2020/0027869 A1    1/2020  Yeh
2021/0313320 A1*  10/2021  Liaw .................. H01L 29/6681

FOREIGN PATENT DOCUMENTS

| CN | 103489867 A | 1/2014 |
| CN | 106024785 A | 10/2016 |
| CN | 106206586 A | 12/2016 |
| CN | 110854184 A | 2/2020 |

* cited by examiner

STATIC RANDOM ACCESS MEMORY

BACKGROUND OF THE INVENTION

1. Field of the Invention

The invention relates to a static random access memory (SRAM). More particularly, the invention relates to a SRAM including double-layered contact structures.

2. Description of the Prior Art

A static random access memory (SRAM) is a kind of volatile memory, which reserves data in the bit cells when the power is continuously applied and loses data when the power is cut off. Because that SRAM may provide fast access speed and is compatible with the logic device process, it has been widely used as an embedded memory of the processor to be a buffer between the processor and the main memory.

With the progress of the semiconductor fabrication technology, the sizes of SRAM bit cells have been greatly miniaturized to achieve higher integrity. However, the process window has been more and more critical. An unexpected process shift may cause SRAM fail to function properly. Therefore, a novel SRAM which may provide a larger process window and a stable product quality is earnestly demanded in the field.

SUMMARY OF THE INVENTION

In light of the above, the present invention is directed to provide a static random access memory (SRAM) having double-layered contact structures with a step profile between the upper contact structure and the lower contact structure.

According to an embodiment of the present invention, a static random access memory (SRAM) is disclosed. The SRAM includes a substrate comprising a first active region and a second active region adjacent to the first active region, a first gate structure crossing the first active region and the second active region, a second gate structure adjacent to a first side of the first gate structure and crossing the first active region, a first lower contact structure disposed on the first active region and adjacent to a second side of the gate structure, and a first upper contact structure disposed on the first lower contact structure and in direct contact with the first lower contact structure, wherein a sidewall of the first upper contact structure and a top surface of the first lower contact structure comprise a step profile therebetween.

According to another embodiment of the present invention, a static random access memory (SRAM) is disclosed. The SRAM includes a substrate comprising a first active region and a third active region adjacent to the first active region, a first gate structure crossing the first active region and the third active region, a lower contact structure disposed on the first active region and the third active region, and an upper contact structure disposed on the lower contact structure and in direct contact with the lower contact structure, wherein a sidewall of the upper contact structure and a top surface of the lower contact structure comprise a step profile therebetween.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
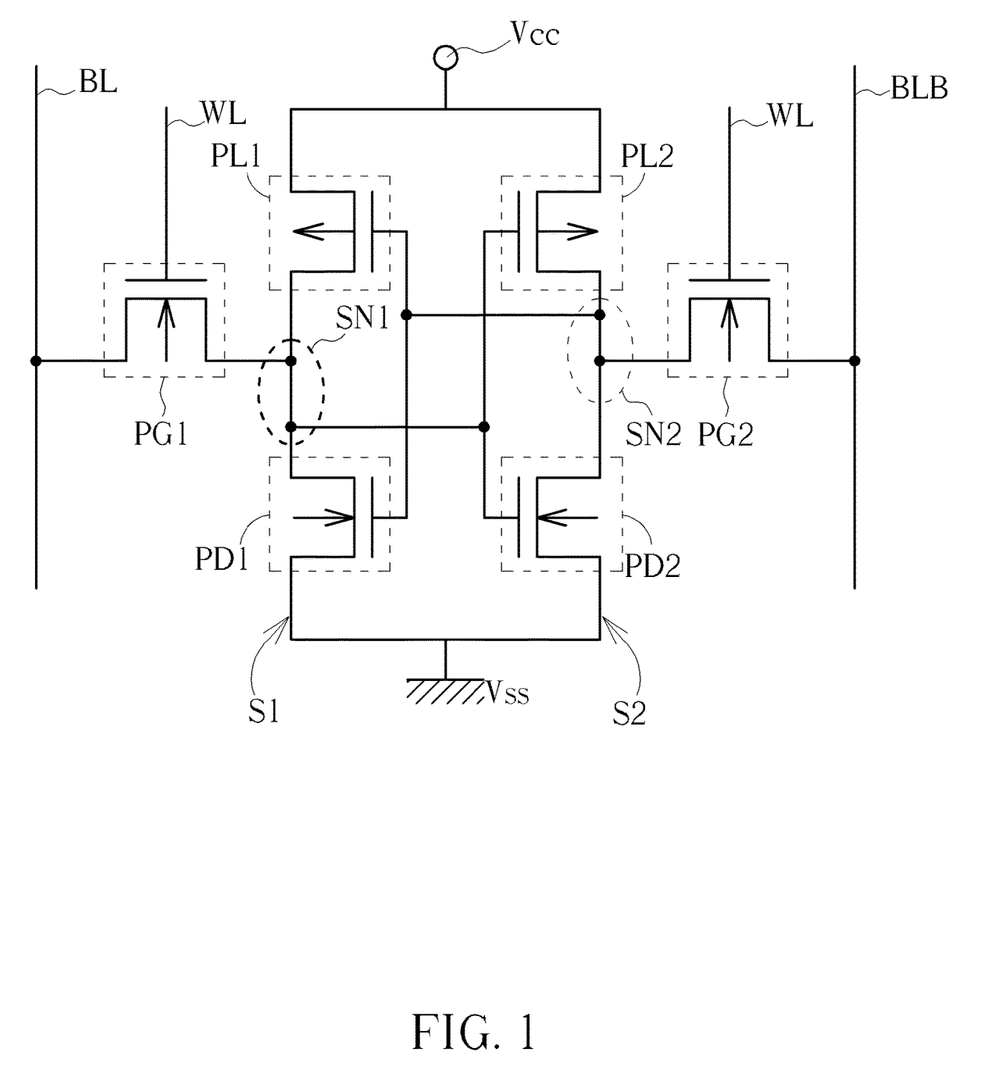
FIG. 1 shows a circuit diagram of a bit cell of a SRAM according to one embodiment of the present invention.

Please refer to FIG. 1, which is a circuit diagram of a bit cell of a SRAM according to one embodiment of the present invention. The bit cell of the SRAM includes six transistors, and therefore the SRAM may be referred to as a 6T-SRAM. Specifically speaking, the six transistors includes a first pull-up transistor PL1, a second pull-up transistor PL2, a first pull-down transistor PD1, a second pull-down transistor PD2, a first access transistor PG1 and a second access transistor PG2.

The first pull-up transistor PL1 and the second pull-up transistor PL2 have a same conductivity type that is complementary to the conductivity type of the first pull-down transistor PD1 and the second pull-down transistor PD2. According to an embodiment, the first pull-up transistor PL1 and the second pull-up transistor PL2 may be p-type metal oxide semiconductor (PMOS) transistors, and the first pull-down transistor PD1 and the second pull-down transistor PD2 may be n-type metal oxide semiconductor (NMOS) transistors. According to an embodiment, the first access transistor PG1 and the second access transistor PG2 may be NMOS transistors as well.

As shown in FIG. 1, the source terminal of the first pull-up transistor PL1 is electrically connected to a power supply voltage Vcc. The drain terminal of the first pull-up transistor PL1 is electrically connected to the drain terminal of the first pull-down transistor PD1. The source terminal of the first pull-down transistor PD1 is electrically connected to a ground voltage Vss. The gate terminal of the first pull-up transistor PL1 and the gate terminal of the first pull-down transistor PD1 are electrically connected to form an inverter. Likewise, the source terminal of the second pull-up transistor PL2 is electrically connected to the power supply voltage Vcc. The drain terminal of the second pull-up transistor PL2 is electrically connected to the drain terminal of the second pull-down transistor PD2. The source terminal of the second pull-down transistor PD2 is electrically connected to the ground voltage Vss. The gate terminal of the second pull-up transistor PL2 and the gate terminal of the second pull-down transistor PD2 are electrically connected to form another inverter. The two inverters are cross-coupled to form a latch circuit by having the gate terminals of the first pull-up transistor PL1 and the first pull-down transistor PD1 electrically connected to the drain terminals of the second pull-up transistor PL2 and the second pull-down transistor PD2, and having the gate terminals of the second pull-up transistor PL2 and the second pull-down transistor PD2 electrically connected to the drain terminals of the first pull-up transistor PL1 and the first pull-down transistor PD1. In this way, the data may be stored in the storage node SN1 or the storage node SN2 of the latch circuit.

The first access transistor PG1 and the second access transistor PG2 are used to control the writing and reading of the data in the bit cell. The first access transistor PG1 is electrically connected between the storage node SN1 and the bit line BL. The second access transistor PG2 is electrically connected between the storage node SN2 and the complementary bit line BLB. The gate terminals of the first access transistor PG1 and the second access transistor PG2 are electrically connected to the word line WL and the channels of the first access transistor PG1 and the second access transistor PG2 may be turned on or turned off by controlling the word line WL. When the first access transistor PG1 and the second access transistor PG2 are turned on, the bit line BL and the bit line BLB are allowed to write or read data.

Figure 2:
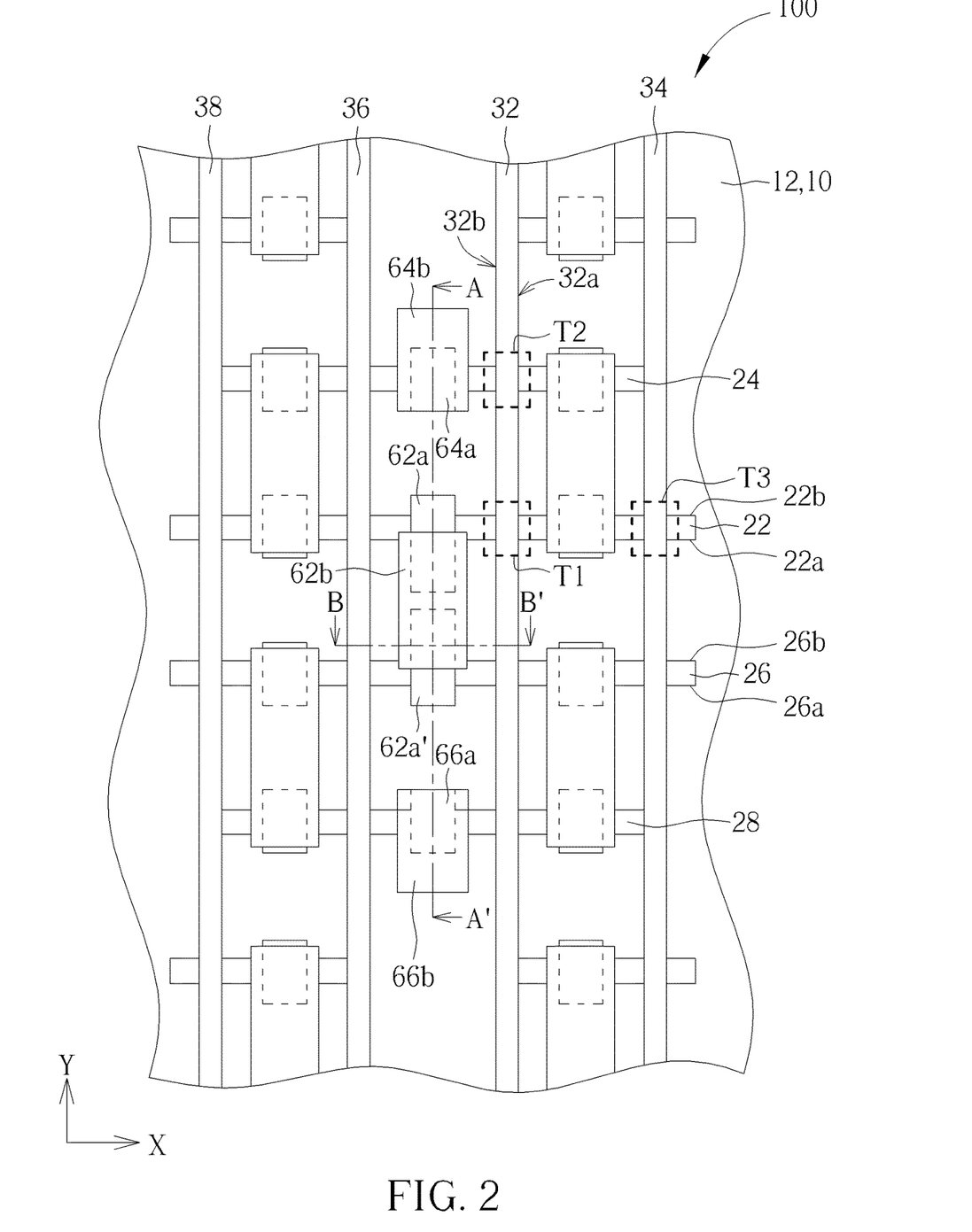
FIG. 2 shows a partial plane view of a SRAM on a plane defined by the first direction X and the second direction Y according to one embodiment of the present invention.
Figure 3:
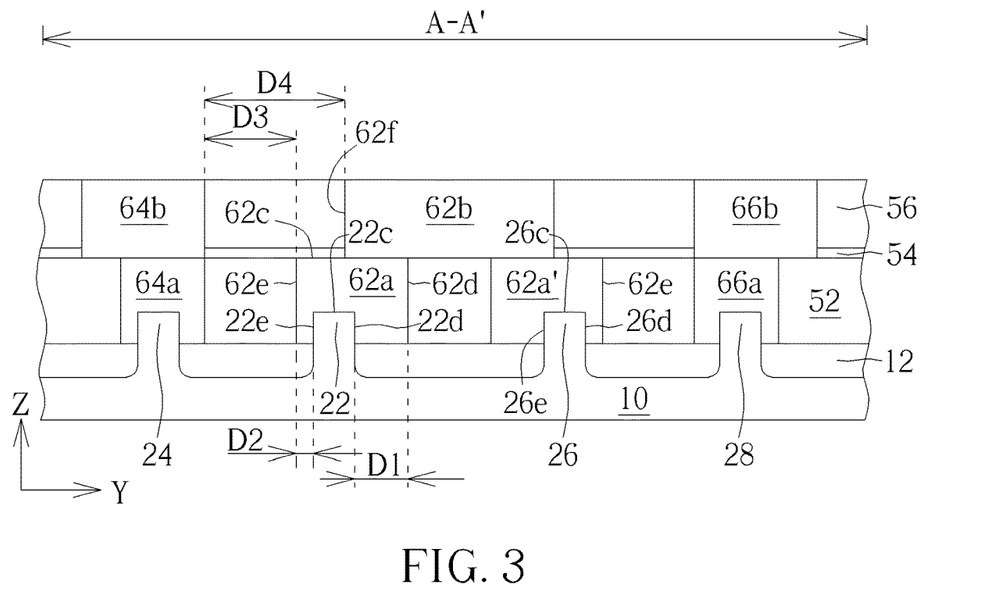
FIG. 3 shows a cross-sectional view of the SRAM on a plane defined by the second direction Y and the third direction Z and along the sectional line AA' shown in FIG. 2.
Figure 4:
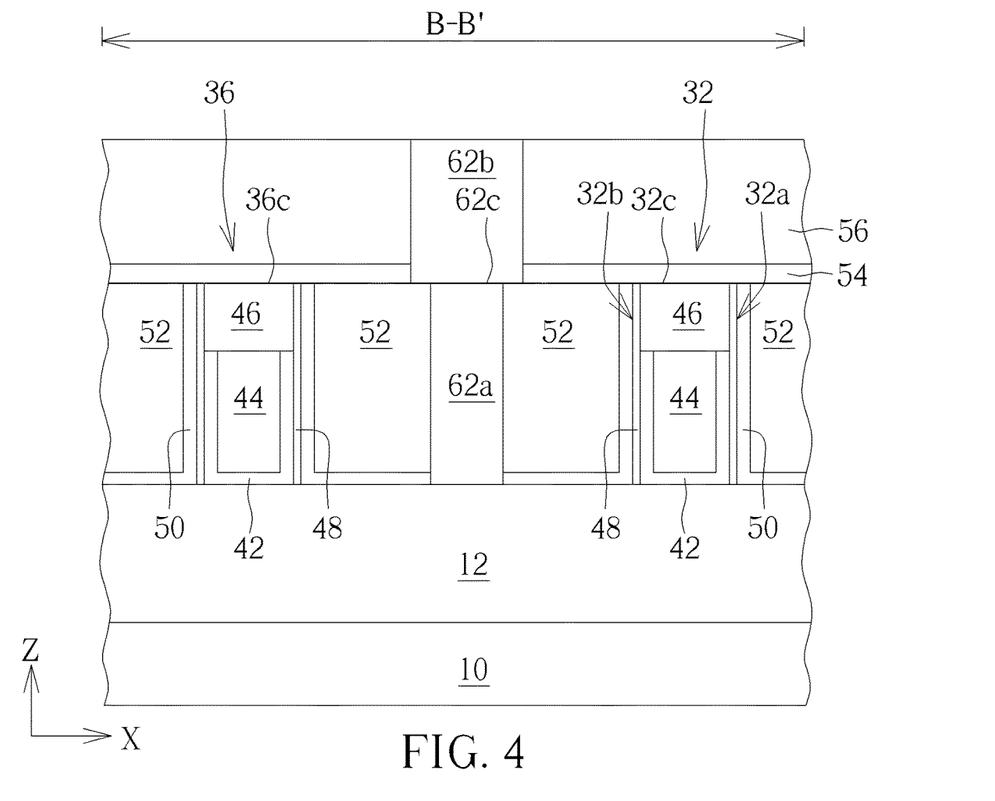
FIG. 4 shows a cross-sectional view of the SRAM on a plane defined by the first direction X and the third direction Z and along the sectional line B-B' shown in FIG. 2.

Please refer to FIG. 2, FIG. 3 and FIG. 4. FIG. 2 is a partial plane view of a static random access memory (SRAM) 100 on a plane defined by the first direction X and the second direction Y (also referred to as XY plane) according to one embodiment of the present invention. FIG. 3 is a cross-sectional view of the SRAM 100 on a plane defined by the second direction Y and the third direction Z (also referred to as YZ plane) and along the sectional line AA' shown in FIG. 2. FIG. 4 is a cross-sectional view of the SRAM 100 on a plane defined by the first direction X and the third direction Z (also referred to as XZ plane) and along the sectional line B-B' shown in FIG. 2. The SRAM 100 may be a 6T-SRAM. The SRAM 100 includes a substrate 10 having a plurality of active regions formed thereon. The active regions extend along the first direction X and are arranged in parallel along the second direction Y. The substrate 10 may be, for example, a silicon substrate, a silicon-on-insulator (SOI) substrate, or a group III-V semiconductor substrate, but is not limited thereto. The active regions at least include a first active region 22, a second active region 24, a third active region 26, and a fourth active region 28, which are extending along the first direction X and are adjacently arranged in parallel along the second direction Y. Specifically, the first active region 22 is located between the second active region 24 and the third active region 26, and the third active region 26 is located between the first active region 22 and the fourth active region 28. The active regions may be formed on the substrate 10 by any suitable process. For example, the active regions may be formed on the substrate 10 by etching the substrate 10 through a single or multiple patterning processes, or by performing a selective epitaxial growth process to form the active regions on the substrate 10, but are not limited thereto. The first active region 22, the second active region 24, the third active region 26, and the fourth active region 28 may be respectively doped with dopants to have desired conductivity types. According to an embodiment, the first active region 22 and the second active region 24 may have a first conductivity type, and the second active region 24 and the fourth active region 28 may have a second conductivity type that is complementary to the first conductivity type. According to an embodiment, the first conductivity type is N type, and the second conductivity type is P type. The substrate 10 further includes an isolation structure 10 surrounding the active regions to make the active regions electrically isolated from each other. The isolation structure 10 may be a shallow trench isolation (STI) structure, but is not limited thereto.

The static random access memory 100 further includes a plurality of gate structures on the substrate 10 and cross the active regions to form transistors of the SRAM 100. As shown in FIG. 2, the gate structures at least include a first gate structure 32, a second gate structure 34, a third gate structure 36 and a fourth gate structure 38, which are extending along the second direction Y and adjacently arranged in parallel along the first direction X. Specifically, the first gate structure 32 is located between the second gate structure 34 and the third gate structure 36, and the third gate structure 36 is located between the first gate structure 32 and the fourth gate structure 38. The second gate structure 34 is adjacent to a first side 32a of the first gate structure 32, and the third gate structure 36 is adjacent to a second side 32b of the first gate structure 32. According to some embodiments, the gate structures may be divided into segments by cut regions to construct the circuit shown in FIG. 1. For the sake of simplicity, the cut regions of the gate structures are not shown in FIG. 2.

The overlapping areas of the gate structures and the active regions are approximately the locations of the transistors of the SRAM 100. As shown in FIG. 2, the first gate structure 32 crosses the first active region 22 and the second active region 24 and overlaps the first active region 22 and the second active region 24 to form a first transistor T1 and a second transistor T2. The second gate structure 34 crosses the first active region 22 and overlaps the first active region 22 to form a third transistor T3. The first transistor T1, the second transistor T2 and the third transistor T3 are the transistors of one of the two inverters in the circuit diagram shown in FIG. 1. Specifically, the first transistor T1 corresponds to the first pull-down transistor PD1, the second transistor T2 corresponds to the first pull-up transistor PL1, and the third transistor T3 corresponds to the first access transistor PG1. In some embodiment, the conductivity type of the first active region 22 is n-type and the first transistor T1 and the third transistor T3 are NMOS transistors. On the other hand, the conductivity type of the second active region 24 is p-type and the second transistor T2 is a PMOS transistor. Likewise, the third gate structure 36 crosses and overlaps the first active region 22 and the second active region 24 to form two transistors (PD2 and PG2), the fourth gate structure 38 crosses the first active region 22 to form one transistor (PL2) of another inverter.

The SRAM 100 further includes a plurality of contact structures to form the electrical connection of the circuit shown in FIG. 1. Please refer to FIG. 2 and FIG. 3. The SRAM 100 includes at least a first lower contact structure 62a disposed on the first active region 22 and adjacent to a second side 32b of the first gate structure 32 and a first upper contact structure 62b disposed on the first lower contact structure 62a and in direct contact with the first lower contact structure 62a, wherein the second side 32b is opposite to the first side 32a of the first gate structure 32. The SRAM 100 further includes a second lower contact structure 64a disposed on the second active region 24 and adjacent to the second side 32b of the first gate structure 32, and a second upper contact structure 64b disposed on the second lower contact structure 64a and in direct contact with the second lower contact structure 64a. In some embodiments, the first upper contact structure 62b is electrically connected to a ground voltage (Vss), and the second upper contact structure 64b is electrically connected to a power supply voltage (Vcc).

In some embodiments, as shown in FIG. 3, the first active region 22, the second active region 24, the third active region 26, and the fourth active region 28 are surrounded by an isolation structure 12 and respectively include a fin-shaped structure protruding from the top surface of the isolation structure 12. A first interlayer dielectric layer 52 is formed on the isolation structure 12 and the active regions, and a second interlayer dielectric layer 56 is formed on the first interlayer dielectric layer 5. The first lower contact structure 62a and the second lower contact structure 64a are disposed in the first interlayer dielectric layer 52. The first upper contact structure 62b and the second upper contact structure 64b are disposed in the second interlayer dielectric layer 56. In some embodiments, an etch stop layer 54 may be disposed between the first interlayer dielectric layer 52 and the second interlayer dielectric layer 56. Another etch stop layer 50 may be disposed between the first interlayer dielectric layer 52 and the substrate 10 or between the first interlayer dielectric layer 52 and the isolation structure 12.

In some embodiments, the gate structures may include metal gates. For example, please refer to FIG. 4, which shows the cross-section views of the first gate structure 32 and the third gate structure 36. The gate structures 32 and 36 may respectively have a work function metal layer 42, a low resistance metal layer 44, a hard mask layer 46 and a spacer 48. It is noteworthy that the top surface 62c of the first lower contact structure is flush with the top surface 32c of the first gate structure 32 and the top surface 36c of the third gate structure 36. In other embodiments, the gate structures may be polysilicon gates according to product needs.

One feature of the invention is that, by shrinking the first upper contact structure 62b along a direction opposite to the second upper contact structure 64b and simultaneously extending the first lower contact structure 62a along a direction opposite to the second lower contact structure 64, the distance between the first upper contact structure 62b and the second upper contact structure 64b may be increased and a larger process window between the first upper contact structure 62b and the second upper contact structure 64b may be obtained. Features of the SRAM provided by the present invention are detailed in the following illustration.

As shown in the plane view of FIG. 2, the first lower contact structure 62a is disposed on the first active region 22 and overlaps two edges 22a and 22b of the first active region 22, and the first upper contact structure 62b only overlaps one of the two edges, that is, the edge 22a of the first active region 22. On the other hand, the second lower contact structure 64a is disposed on the second active region 24 and overlaps two edges 24a and 24b of the second active region 24, and the second upper contact structure 64b also overlaps the two edges 24a and 24b of the second active region 24.

As shown in the cross-sectional view of FIG. 3, the first lower contact structure 62a overlaps at least three edges of the fin-shaped structure of the first active region 22, that is, the top surface 22c and the two sidewalls 22d and 22e of the first active region 22. The sidewall 22d and the sidewall 22e shown in FIG. 3 respectively correspond to the edge 22a and the edge 22b as shown in FIG. 2.

The first upper contact structure 62b overlaps only a portion of the top surface 62c of the first lower contact structure 62a. The sidewall 62f of the first upper contact structure 62b and the top surface 62c of the first lower contact structure 62a include a step profile therebetween.

The second lower contact structure 64a overlaps at least three edges of the fin-shaped structure of the second active region 24, such as the top surface and the two sidewalls of the fin-shaped structure. The second upper contact structure 64b may completely overlap or partially overlap the top surface of the second lower contact structure 64a.

As shown in FIG. 3, the distance between the first active region 22 and the sidewall 62d of the first lower contact structure 62a overlapped with the first upper contact structure 62b is D1. The distance between the first active region 22 and the sidewall 62e of the first lower contact structure 62a not overlapped with the first upper contact structure 62b is D2. In a preferred embodiment, the distance D1 is larger than the distance D2. The distance between the first lower contact structure 62a and the second lower contact structure 64a is D3. The distance between the first upper contact structure 62b and the second upper contact structure 64b is D4. In a preferred embodiment, the distance D4 is larger than the distance D3.

In some embodiments, the SRAM 100 further includes a third lower contact structure 62a' disposed on the third active region 26 and adjacent to the second side 32b of the first gate structure 32, a fourth lower contact structure 66a disposed on the fourth active region 28 and adjacent to the second side 32b of the first gate structure 32, and a fourth upper contact structure 66b disposed on the fourth lower contact structure 66a and in direct contact with the fourth lower contact structure 66a.

The arrangements of the third lower contact structure 62a', the fourth lower contact structure 66a, the first upper contact structure 62b and the fourth upper contact structure 66b may be similar to the arrangements of the first lower contact structure 62a, the second lower contact structure 64a, the first upper contact structure 62b and the second upper contact structure 64b.

As shown in the FIG. 3, the third lower contact structure 62a' and the fourth lower contact structure 66a are formed in the first interlayer dielectric layer 52. The fourth upper contact structure 66b is formed in the second interlayer dielectric layer 56. The first upper contact structure 62b is in direct contact with both the first lower contact structure 62a and the third lower contact structure 62a' and is electrically connected to the ground voltage Vss. The fourth upper contact structure 66b is electrically connected to the power supply voltage Vcc.

The third lower contact structure 62a' overlaps at least three edges of the fin-shaped structure of the third active region 26, that is, the top surface 26c and the two sidewalls 26d and 26e of the third active region 26. The sidewall 26d and the sidewall 26e shown in FIG. 3 respectively correspond to the edge 26a and the edge 26b as shown in FIG. 2. The first upper contact structure 62b overlaps only a portion of the top surface of the third lower contact structure 62a', and the sidewall of the first upper contact structures 62b and the top surface of the third lower contact structure 62a' include a step profile therebetween. The fourth lower contact structure 66a overlaps at least three edges of the fin-shaped structure of the fourth active region 28, that is, the top surface and the two sidewalls of the fin-shaped structure. The fourth upper contact structure 66b may completely overlap or partially overlap the top surface of the fourth lower contact structure 66a. Other detailed arrangements of the third lower contact structure 62a', the fourth lower contact structure 66a, the first upper contact structure 62b and the fourth upper contact structure 66b may be referred to the previous descriptions with respect to the first lower contact structure 62a, the second lower contact structure 64a, the first upper contact structure 62b and the second upper contact structure 64b, and are not repeated for the sake of brevity.

Figure 5:
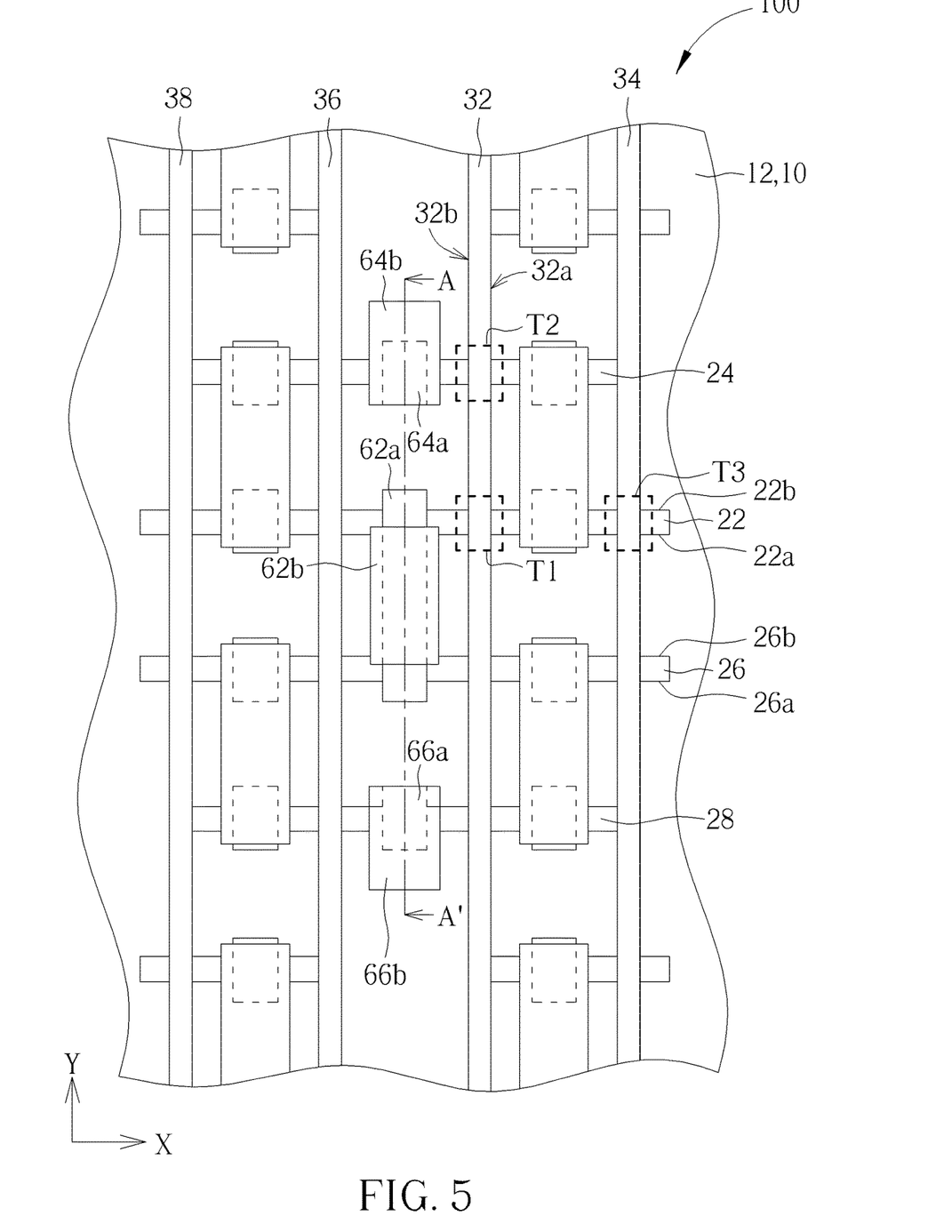
FIG. 5 shows a partial plane view of a SRAM on a plane defined by the first direction X and the second direction Y according to another embodiment of the present invention.
Figure 6:
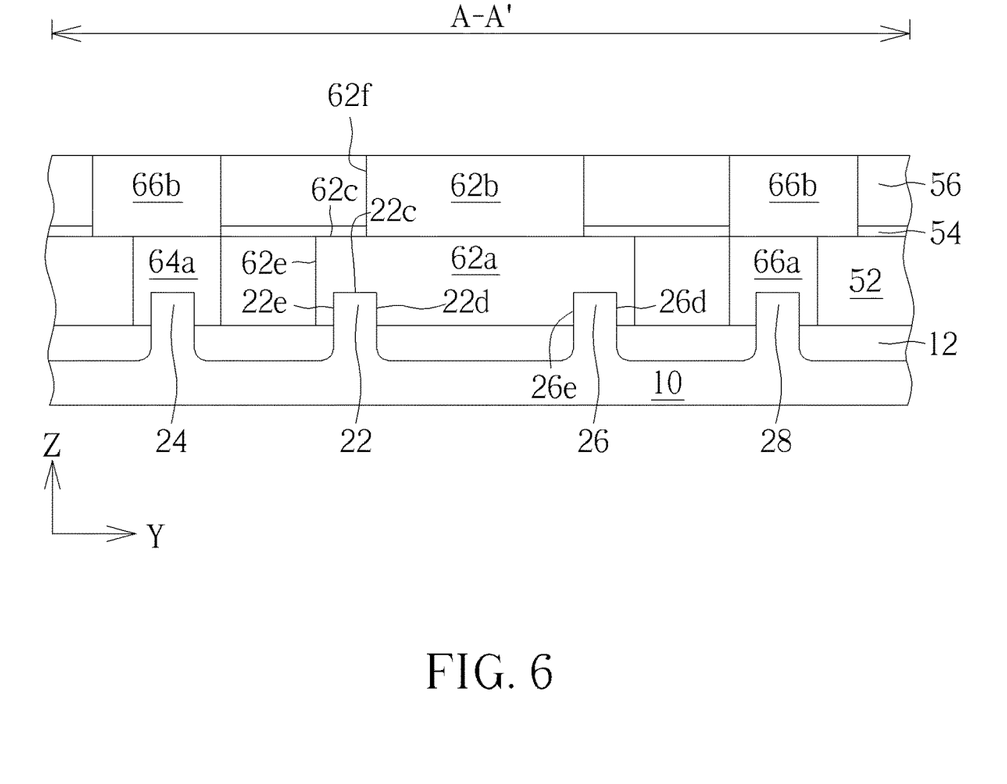
FIG. 6 shows a cross-sectional view of the SRAM on a plane defined by the second direction Y and the third direction Z and along the sectional line AA' shown in FIG. 5.

Please refer to FIG. 5 and FIG. 6. FIG. 5 is a partial plane view of a SRAM on the XY plane according to another embodiment of the present invention. FIG. 6 is a cross-sectional view of the SRAM on the YZ plane along the sectional line AA' as shown in FIG. 5. For the sake of simplicity, like reference numerals are used to refer to the same material layers or process steps described previously. The difference between the embodiment shown in FIG. 5 and FIG. 6 and the embodiment shown in FIG. 2 to FIG. 4 is that, the first lower contact structure 62a of the SRAM 100 shown in FIG. 5 extends longer along the second direction Y and crosses both the first active region 22 and the third active region 26.

As shown in FIG. 5, the first lower contact structure 62a overlaps the two edges 22d and 22e of the first active region 22 and the two edges 26a and 26b of the third active region 26. The first upper contact structure 62b is disposed on the first lower contact structure 62a and overlaps one of the two edges (that is, the edge 22a) of the first active region 22 and one of the two edges (that is, the edge 26b) of the third active region 26. In comparison with the embodiment shown in FIG. 2 and FIG. 3 in which the first active region 22 and the third active region 26 are respectively electrically connected by the first lower contact structure 62a and the third lower contact structure 62a', the SRAM 100 shown in FIG. 5 may avoid defects or pattern deformity due to insufficient spacing between the first lower contact structure 62a and the third lower contact structure 62a'. In this way, the process window of the SRAM may be improved.

Figure 7:
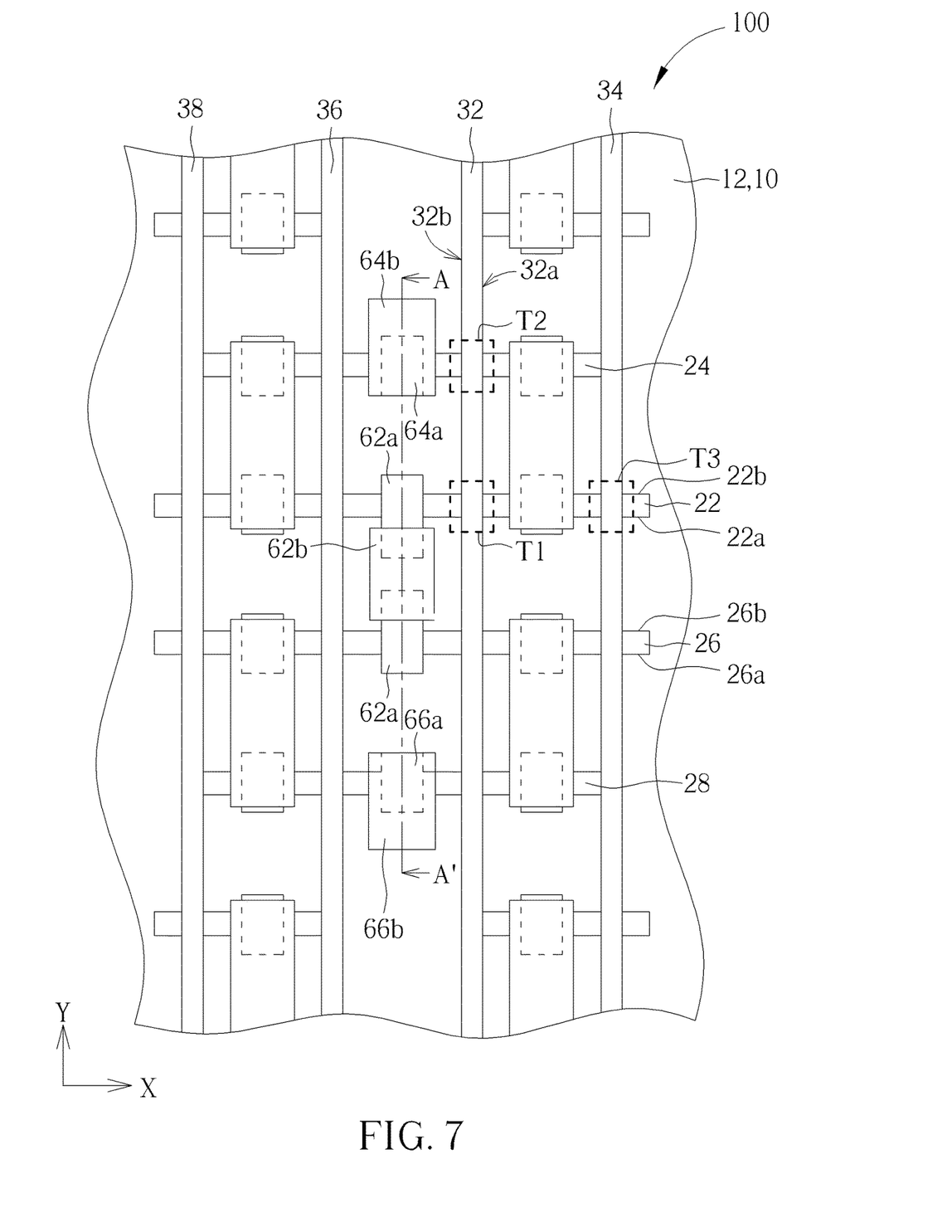
FIG. 7 shows a partial plane view of a SRAM on a plane defined by the first direction X and the second direction Y according to another embodiment of the present invention.
Figure 8:
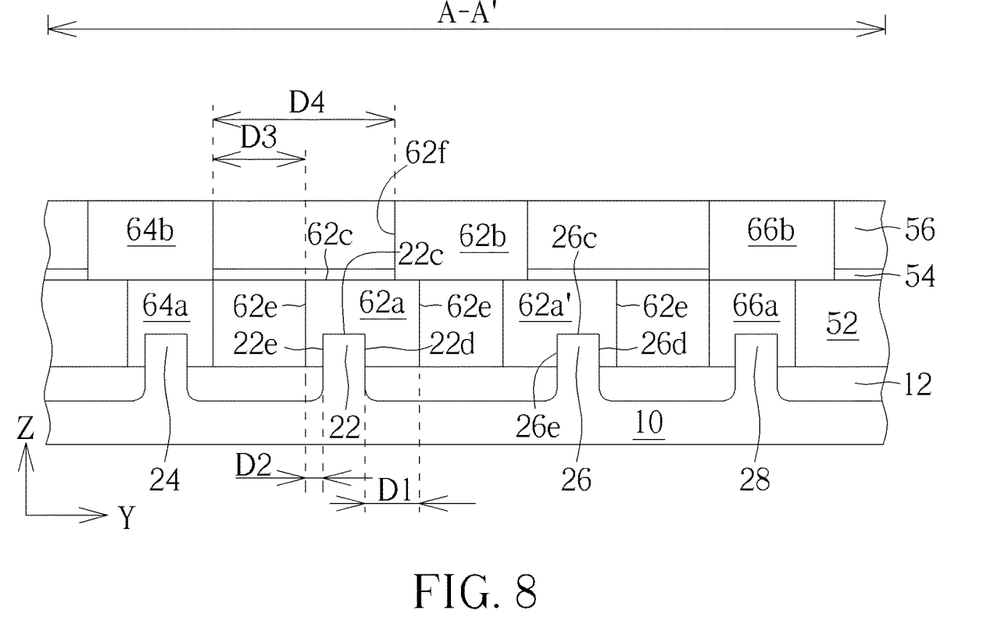
FIG. 8 shows a cross-sectional view of the SRAM on a plane defined by the second direction Y and the third direction Z and along the sectional line AA' shown in FIG. 7.

Please refer to FIG. 7 and FIG. 8. FIG. 7 is a partial plane view of a SRAM on the XY plane according to another embodiment of the present invention. FIG. 8 is a cross-sectional view of the SRAM on the YZ plane along the sectional line AA' as shown in FIG. 7. For the sake of simplicity, like reference numerals are used to refer to the same material layers or process steps described previously. In the embodiment shown in FIG. 7 and FIG. 8, as long as the overlapping area of first lower contact structure 62a and the first upper contact structure 62b are sufficient to provide a desirable contact resistance, the first upper contact structure 62b may be further shrunk along the direction opposite to the second upper contact structure 64b to increase the distance D4 between the first upper contact structure 62b and the second upper contact structure 64b. In this way, the process window may be further improved.

In summary, the SRAM provided by the present invention has double-layered contact structures. Each of the contact structures is formed by a lower contact structure formed in a first interlayer dielectric layer and an upper contact structure formed in a second interlayer dielectric layer. The SRAM provided by the present invention may have an improved process window by increasing the distance between the first upper contact structure and the second upper contact structure, that is, by shrinking the first upper contact structure in the second interlayer dielectric layer along a direction opposite to the second upper contact structure and simultaneously extending the first lower contact structure in the first interlayer dielectric layer along a direction opposite to the second lower contact structure. In this way, the process window may be improved while a sufficient overlapping area and desirable resistance between the first lower contact structure and the first upper contact structure may be maintained. The increased distance between the first upper contact structure and the second upper contact structure may also be beneficial to reduce the interference between the source of the ground voltage and the source of the power supply voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM), comprising:
a substrate comprising a first active region and a second active region adjacent to the first active region;
a first gate structure crossing the first active region and the second active region;
a second gate structure adjacent to a first side of the first gate structure and crossing the first active region, wherein the first gate structure and the second gate structure respectively comprise a metal layer and a hard mask layer on the metal layer, and a spacer along sidewalls of the metal layer and the hard mask layer;
a first interlayer dielectric layer on the substrate and surrounding the first gate structure and the second gate structure, wherein the first interlayer dielectric layer has a single layered structure;
a second interlayer dielectric layer on the first interlayer dielectric layer;
an etching stop layer disposed between the first interlayer dielectric layer and the substrate;
a first lower contact structure and a third lower contact structure through the first interlayer dielectric layer and the etching stop layer on the first active region and respectively adjacent to a second side and the first side of the first gate structure, wherein the first lower contact structure and the third lower contact structure respectively comprises a first edge locating between the first active region and the second active region and a second edge opposite to the first edge, wherein the first edges of the first lower contact structure and the third lower contact structure are aligned, the second edges of the first lower contact structure and the third lower contact structure are not aligned, wherein a top surface of the first lower contact structure, a top surface of the first interlayer dielectric layer, top surfaces of the hard mask layer and the spacer of the first gate structure and top surfaces of the hard mask layer and the spacer of the second gate structure are flush with each other; and a first upper contact structure disposed in the second interlayer dielectric layer on the first lower contact structure and in direct contact with the first lower contact structure and overlapping the second edge of the first lower contact structure, wherein a top surface of the first upper contact structure is flush with a top surface of the second interlayer dielectric layer, a sidewall of the first upper contact structure and the top surface of the first lower contact structure comprise a step profile therebetween.

2. The SRAM according to claim 1, wherein a distance between the first active region and a sidewall of the first lower contact structure overlapped by the first upper contact structure is larger than a distance between the first active region and another sidewall of the first lower contact structure not overlapped by the first upper contact structure.

3. The SRAM according to claim 1, wherein the first lower contact structure overlaps two edges of the first active region.

4. The SRAM according to claim 3, wherein the first upper contact structure overlaps one of the two edges of the first active region.

5. The SRAM according to claim 1, wherein the first active region and the second active region comprise fin-shaped structures.

6. The SRAM according to claim 5, wherein the first lower contact structure overlaps a top surface and two sidewalls of the first active region.

7. The SRAM according to claim 1, wherein the first gate structure crosses the first active region to form a first transistor and crosses the second active region to form a second transistor, the second gate structure crosses the first active region to form a third transistor.

8. The SRAM according to claim 7, wherein the first transistor and the third transistor are NMOS transistors, the second transistor is a PMOS transistor.

9. The SRAM according to claim 1, further comprising:

a second lower contact structure disposed on the second active region and adjacent to the second side of the first gate structure; and a second upper contact structure disposed on the second lower contact structure and in direct contact with the second lower contact structure, wherein a distance between the first upper contact structure and the second upper contact structure is larger than a distance between the first lower contact structure and the second lower contact structure.

10. The SRAM according to claim 9, wherein the first upper contact is electrically connected to a ground voltage (Vss), and the second upper contact structure is electrically connected to a power supply voltage (Vcc).

11. The SRAM according to claim 1, further comprising:

an isolation structure in the substrate and surrounding the first active region and the second active region.

\* \* \* \* \*